(12) United States Patent
Sherman

(10) Patent No.: US 6,877,071 B2
(45) Date of Patent: Apr. 5, 2005

(54) MULTI-PORTED MEMORY

(75) Inventor: David L. Sherman, Fremont, CA (US)

(73) Assignee: Technology IP Holdings, Inc., Santa Clara, CA (US)

( * ) Notice: Subject to any disclaimer, the term of this patent is extended or adjusted under 35 U.S.C. 154(b) by 72 days.

(21) Appl. No.: 10/227,196

(22) Filed: Aug. 20, 2002

(65) Prior Publication Data

US 2003/0056061 A1 Mar. 20, 2003

Related U.S. Application Data

(60) Provisional application No. 60/314,338, filed on Aug. 20, 2001.

(51) Int. Cl.$^7$ ............................................... G06F 13/00
(52) U.S. Cl. ....................... 711/149; 711/100; 711/131; 711/154
(58) Field of Search ................................. 711/100, 131, 711/149, 154; 365/230.03, 230.05, 230.07

(56) References Cited

U.S. PATENT DOCUMENTS

| | | | |
|---|---|---|---|
| 5,717,646 A | | 2/1998 | Kyi |
| 5,815,456 A | * | 9/1998 | Rao ...................... 365/230.03 |
| 5,990,564 A | | 11/1999 | Degani et al. |
| 6,075,711 A | | 6/2000 | Brown et al. |
| 6,141,287 A | | 10/2000 | Mattausch |
| 6,189,073 B1 | | 2/2001 | Pawlowski |
| 6,212,607 B1 | | 4/2001 | Miller et al. |
| 6,233,659 B1 | | 5/2001 | Cohen et al. |
| 6,329,712 B1 | | 12/2001 | Akram et al. |
| 6,335,899 B1 | * | 1/2002 | Jung ...................... 365/230.05 |
| 6,360,344 B1 | | 3/2002 | Khoche et al. |
| 6,400,575 B1 | | 6/2002 | Brown et al. |
| 2002/0058395 A1 | | 5/2002 | Akram et al. |
| 2003/0076731 A1 | * | 4/2003 | Terada .................... 365/230.05 |

OTHER PUBLICATIONS

"10Gb/s 3.3V Quadport™ DSE Family," available at http://www.cypress.com, Cypress Semiconductor Corporation, 3901 North First Street San Jose, CA USA (2002).

"3.3V 64K/128K/256K x36 and 128/256K x 18 Synchronous Dual–port RAM," available at http://www.cypress.com, Cypress Semiconductor Corporation, 3901 North First Street San Jose, CA USA (2002).

"Introducing the Cypress Quadport™ Switch," (CY7CO4308V), available at http://www.cypress.com, Cypress Semiconductor Corporation, 3901 North First Street San Jose, CA USA (2002).

"Low Power Clock Distribution," *Low Power Design Methodologies*, Jan M. Rabaey and Massoud Pedram eds., Kluwer Academic Publishers, Norwell, MA USA, pp. 119–125 (1996).

"Using Quadport™ DSE Switching Applications," available at http://www.cypress.com, Cypress Semiconductor Corporation, 3901 North First Street San Jose, CA USA (2002).

* cited by examiner

*Primary Examiner*—Tuan V. Thai
(74) *Attorney, Agent, or Firm*—Townsend and Townsend and Crew LLP (57) ABSTRACT

In accordance with an embodiment of the invention, a semiconductor memory includes a number of data ports each having a predetermined number of data bits. The memory further has a number of memory macros each including at least one memory array having rows and columns of memory cells. Each memory macro further includes a plurality of internal data connection points directly connected to external terminals to transfer data to or from the at least one memory array. The internal data connection points correspond in number to the number of the data ports, and the internal data connection points in the memory macros together form the plurality of data ports.

8 Claims, 10 Drawing Sheets

MULTI-PORTED MEMORY

CROSS-REFERENCE TO RELATED APPLICATION

This is a non-provisional of and claims priority from U.S. Application No. 60/314,338, filed Aug. 20, 2001, which is incorporated herein by reference.

BACKGROUND OF THE INVENTION

Many systems such as parallel processor systems, artificial intelligence systems, or multimedia systems, typically include a plurality of cooperating sub-systems for processing data. One decisive problem for the efficient practical realization of these systems is the storage of data to be processed, as well as their data processing programs. The most powerful systems would be realizable if a memory is available to which the sub-systems can gain access chronologically parallel and with a high bandwidth. Such memories, which have multiple ports as external terminals, to which the external component units can gain access chronologically parallel, are generally known as multi-port memories. An especially important peripheral condition for economical reasons is naturally the least possible expenditure for surface area on the chip. Other peripheral conditions are due to the demand for the shortest possible access times to the memory cells or ports, and the least possible power loss of the entire memory system.

In the networking area, line cards in today's communications systems are increasingly being challenged on all performance fronts. On one hand, the exponential increase in line rates from OC-12 to OC-48, and now OC-192, has forced designers to greatly increase the throughput requirements of line cards to process at 'wire speed'. On the other hand, the demands on line card functionality have also increased significantly, as each packet received needs to be examined from Layer 2 all the way through Layer 7. Security Processing, Packet Classification, Content-based switching, Traffic Management, and Per-Flow Queuing are all requirements of today's communication routing and switching systems. These bandwidth and functionality requirements put extra strain on the memory elements in the system.

Packet buffering and memory management have become one of the critical design challenges in packet routing/switching systems today. Recent advances in both SRAM and SDRAM memory technology have aimed to break down the line card memory bottleneck. Double Data Rate (DDR) and Quad Data Rate (QDR) SRAMs have emerged as standard memory solutions that effectively double the per-pin bit rate by clocking the data on both the positive and negative edges of the clock. On the SDRAM front, Reduced Latency DRAM (RLDRAM) and Fast Cycle RAM (FCRAM) are technologies that specifically aim to remove the long latency associated with SDRAM, thereby making DRAM memory more applicable to the high bandwidth random access read/writes that are required in networking line cards. Both DDR/QDR SRAM and the new SDRAM technologies offer significant bandwidth improvements over previous generations, basically providing 'just enough' performance to be used in 10 Gbps line card designs. However, while DDR/QDR SRAM and RLDRAM/FCRAM are steps in the right direction in terms of raw bandwidth capability, these are still standard memories that do not specifically address the data-flow needs of typical line cards.

Thus, a multi-ported semiconductor memory having high bandwidth, low latency, and low power, with multiple address and data ports which can easily be reconfigured is desirable.

BRIEF SUMMARY OF THE INVENTION

In accordance with an embodiment of the invention, a semiconductor memory includes a number of data ports each having a predetermined number of data bits. The memory further has a number of memory macros each including at least one memory array having rows and columns of memory cells. Each memory macro further includes a plurality of internal data connection points directly connected to external terminals to transfer data to or from the at least one memory array. The internal data connection points correspond in number to the number of the data ports, and the internal data connection points in the memory macros together form the plurality of data ports.

In another embodiment, the memory macros correspond in number to the predetermined number of data bits in each of the plurality of data ports.

In another embodiment, the internal data connection points in each memory macro equals in number to the number of the data ports, and the memory macros equals in number to the predetermined number of data bits in each of the data ports.

In another embodiment, the internal data connection points in each memory macro equals in number to a multiple X of the number of the plurality of data ports, and the memory macros equals in number to a fraction 1/X of the predetermined number of data bits in each of the data ports, X being a positive integer greater than one.

In another embodiment, the semiconductor memory further includes an integrated circuit housing the plurality of memory macros, wherein each of the internal data connections pints is directly coupled to a corresponding external data connection point.

In another embodiment, the semiconductor memory further includes a package and an interconnect substrate coupled between the integrated circuit and the package. The interconnect substrate houses the external data connection points and data interconnect lines configured to couple each of the external data connection points to a corresponding data terminal in the package.

In another embodiment, each of the memory macros includes a full read and write data path independent of the data path in the other memory macros.

The following detailed description and the accompanying drawings provide a better understanding of the nature and advantages of the present invention.

DETAILED DESCRIPTION OF THE INVENTION

In this disclosure, "data", unless specified as "read data" or "write data", covers both read and write data. A "memory bank" as used in this disclosure refers to a logical sub-division of the total memory, and a "sub-bank" as used in this disclosure refers to a physical memory array forming part of the total memory.

Figure 1A:
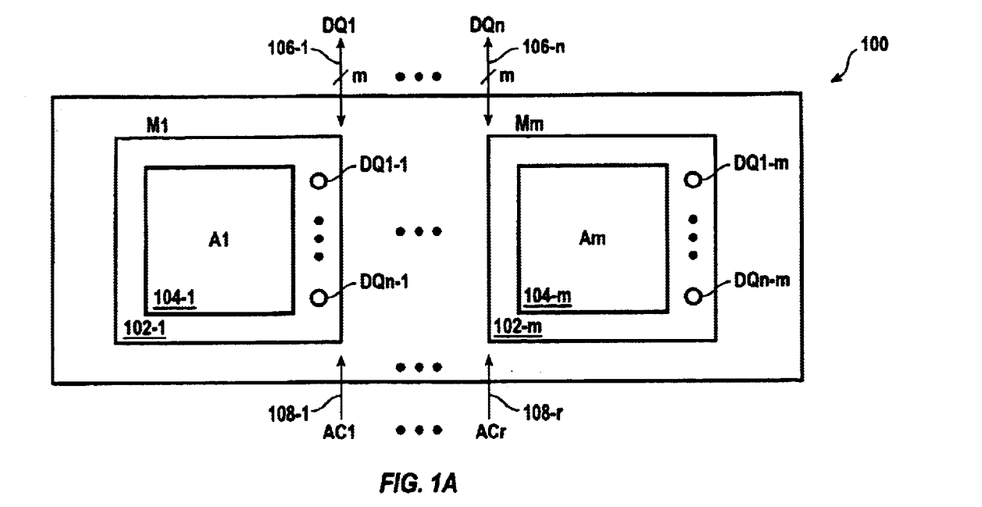
FIG. 1A shows a simplified top view of a multi-ported memory, providing a physical illustration of the memory architecture in accordance with the invention.

FIG. 1A shows a simplified top view of a multi-ported memory 100, and is intended to provide a physical illustration of the memory architecture in accordance with the invention. Memory 100 has n data ports DQ1 through DQn and r address-command ports AC1 through ACr. Each data port is m bits wide. Memory 100 further includes m memory macros M1 through Mm. Each memory macro includes at least one memory sub-array and n internal data connection points. For example, memory macro M1 includes memory sub-array A1 and internal data connection points DQ1-1 through DQn-1. Each memory sub-array includes rows and columns of memory cells (not shown). The n internal data connection points in each of the m memory macros together form the n data ports of memory 100. Thus, the internal data connection points are the data entry and exit points through which data is transferred between the memory sub-arrays and such external devices as memory controller or CPU. The data ports DQ1 106-1 through DQn 106-$n$ as shown in FIG. 1A are thus merely illustrative. That is, data ports DQ1 through DQn are not physically clustered together as is commonly done in conventional memories, but are distributed among the m memory macros.

As can be seen, the number of internal data connection points (n) in each memory macro equals the number of data ports (n), and the number of memory macros (m) equals the width (m) of each data port. Accordingly, internal data connection points DQ1-1 through DQn-1 in memory macro M1 respectively represent the bit 1 position of data ports DQ1 through DQn. Similarly, internal data connection points DQ1-M through DQn-m in memory macro Mm respectively represent the bit m position of data ports DQ1 through DQn. The number of address-command ports (r) and the number of data ports (n) are independent of each other. However, the number of address-command ports is typically less than or equal to the number of data ports.

Figure 5A:
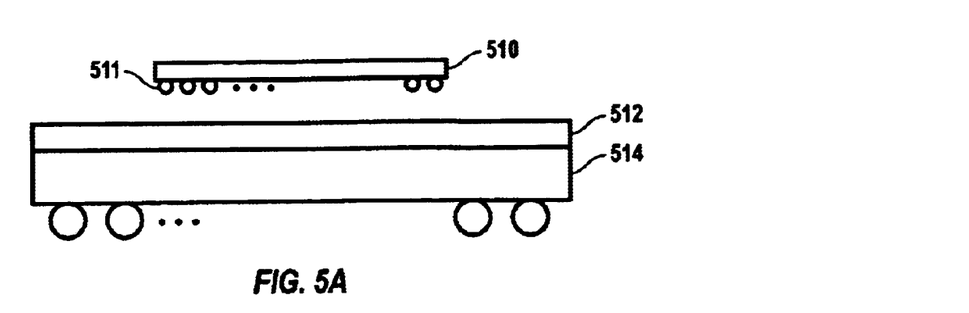
FIGS. 5A, 5B, and 5C show three ways of integrating the memory die with a low dielectric constant (k) interconnect substrate, and a standard package.
Figure 5B:
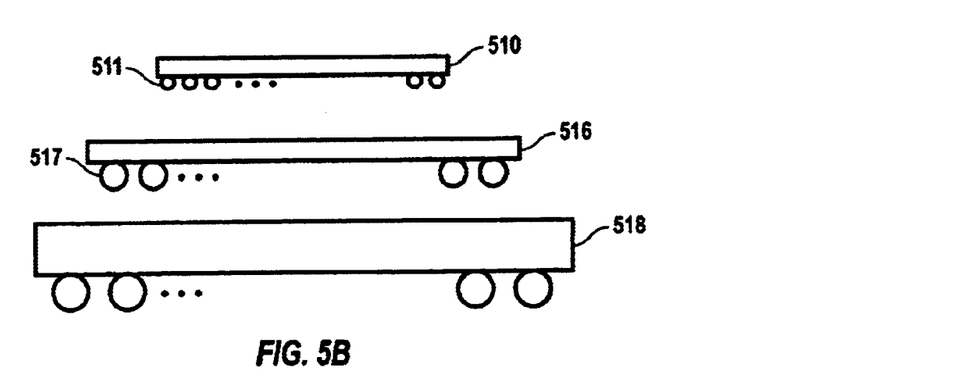
Figure 5C:
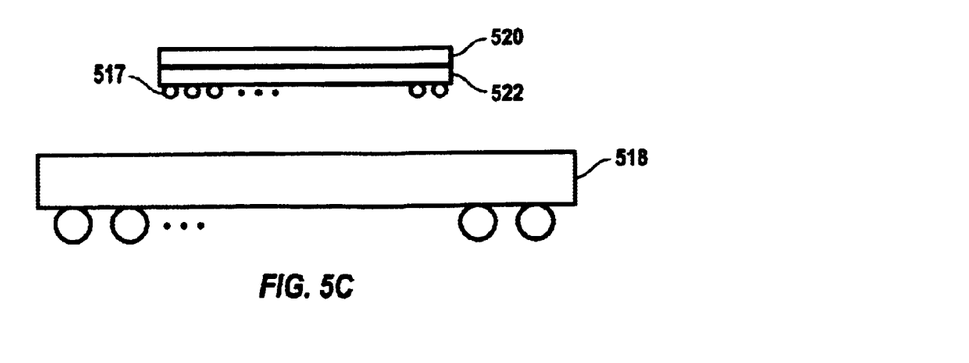

The data connection points in each memory macro are pads or bumps which can be directly connected to corresponding external connection points as shown by the cross-section views in FIGS. 5A, 5B and 5C. This aspect of the invention is described in detail further below.

As can be seen, unlike conventional memory architectures wherein the entire data path is physically located together in the periphery area along one or more sides of the memory, the data path in FIG. 1A is distributed between the m memory macros. That is, each memory macro has its own data path independent of the other memory macros. This configuration allows high-speed read and write memory access times since the data path (including the data buses) is local to each block. This configuration also provides a high degree of flexibility in implementing multi-ported memories wherein the number of data ports and the width of each data port can easily be changed with minimal impact on area consumption and memory performance. Further, any of the address-command ports can control any one or more of the data ports. Moreover, each data port can operate at the clock frequency or a fraction thereof (e.g., one-half the clock frequency or one-quarter the clock frequency).

Accordingly, three variables n, m, and r determine the configuration of memory 100. For example, for n=6, m=36, r=3, memory 100 would have 3 address-command ports, 6 data ports each being 36 bits wide, and 36 memory macros M1–M36 each having 6 data connection point.

Figure 1B:
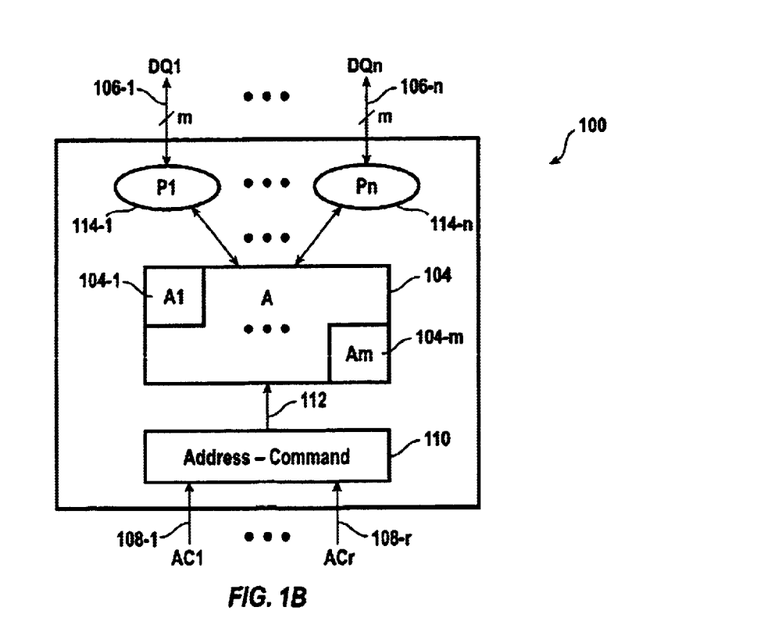
FIG. 1B shows a schematic block diagram of memory in accordance with the invention.

While FIG. 1A provides a top level physical illustration of the memory architecture, FIG. 1B shows a schematic block diagram of memory 100 in accordance with the invention. As shown in FIG. 1B, memory arrays A1 through Am together form the entire memory array 104. Any one of the address-command ports AC1 through ACr can access array 104 through address-command block 110. Any one of the data ports DQ1 through DQn can transfer data to or from array 104 through corresponding ports P1 through Pn. And, any one or more of the data ports can be configured to respond to any one of the address-command ports. Further, data can be transferred between the data ports bypassing the memory array. Although FIG. 1B schematically shows ports P1 through Pn to be along one side of memory 100, these ports are physically distributed among the m memory macros.

While FIGS. 1A and 1B show a single bank memory implementation, FIGS. 2A, 2B, 2C, and 2D show a multiple-bank (j banks) implementation of a memory 200 in accordance with an exemplary embodiment of the present invention. Similar to FIGS. 1A and 1B, FIGS. 2A and 2B show a top level physical illustration of the multiple-bank memory architecture and a schematic block diagram of memory 200, respectively.

Figure 2A:
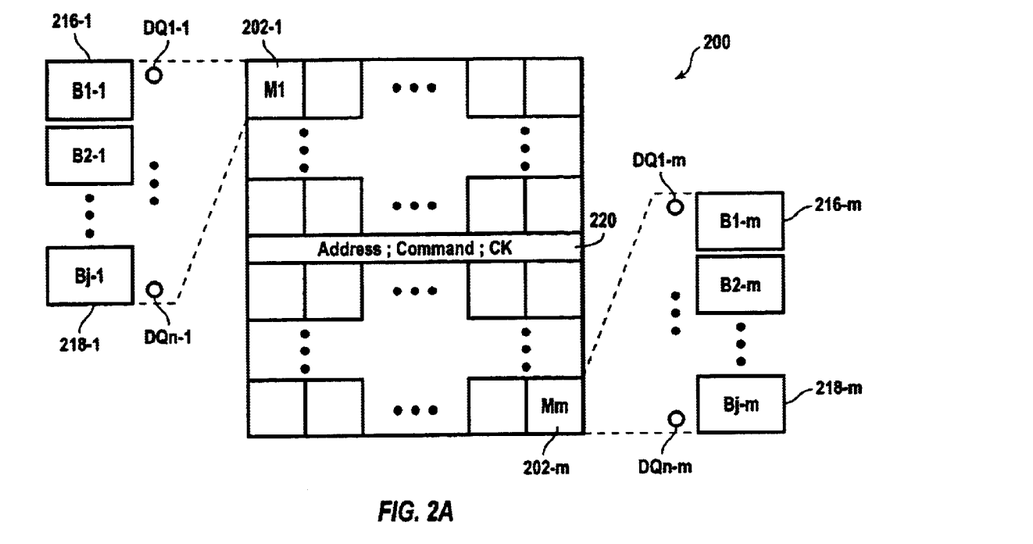
FIGS. 2A, 2B, 2C, and 2D show a multiple-bank implementation of a memory in accordance with an exemplary embodiment of the present invention.

In FIG. 2A, memory 200 includes m memory banks M1 through Mm arranged in a tile configuration. Each of the memory macros includes j sub-banks. For example, memory macro M1 includes sub-banks B1-1 through Bj-1, and memory macro Mm includes sub-banks B1-$m$ through Bj-m. Sub-banks B1-1 through B1-$m$ together makeup bank B1 (FIG. 2B), sub-banks Bj-1 through Bj-m together make up bank Bj (FIG. 2B).

Figure 2B:
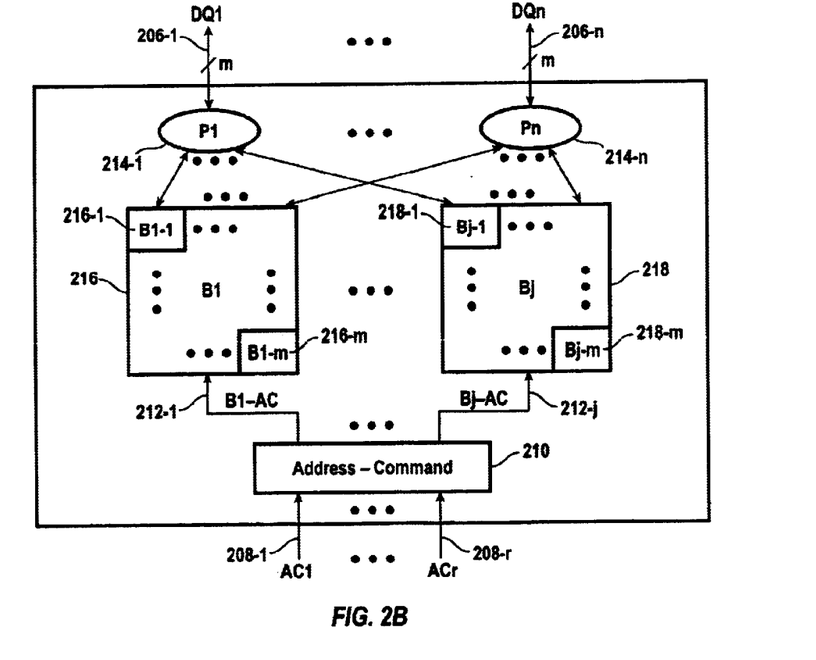

In one embodiment, memory 200 includes n data ports DQ1 through DQn each being m bits wide as shown in FIG. 2B. In FIG. 2A, each memory macro M includes n data connection points each representing one bit of a corresponding m bit wide data port. That is, the n internal data connection points in the m memory macros together form the n data ports DQ1 through DQn of memory 200. For example, internal data connection points DQ1-1 through DQn-1 in memory macro M1 represent the bit 1 position of respective data ports DQ1 through DQn. Similarly, internal data connection points DQ1-$m$ through DQn-m in memory macro Mm represent the bit m position of respective data ports DQ1 through DQn. Thus, data ports DQ1 through DQn in FIGS. 2A and 2B are not physically clustered together but rather are distributed among the m memory macros. In a memory operation, each memory macro could be viewed as carrying one bit of each of the n data ports.

In FIG. 2A, a central area 220 of memory 200 is allocated to address, command, and clock circuit blocks. Area 220 also includes the pads or bumps to which external address, command, and clock signals are connected. The physical location of area 220 is not limited to the center of memory 200, but can be located along a side of memory 200. Each of the macros M1 through Mm are identical in construction. Thus, once one macro is designed and laid out, the entire set of m macros can quickly be formed by placing the single macro the requisite number of times (m) in whatever formation that best suits the design goals.

In FIG. 2B, memory 200 has an address-command block 210 which receives r address-command ports AC1 through ACr and in turn provides dedicated control signals (B1-AC through Bj-AC) to each of the j banks. Any one of the address-command ports AC1 through ACr can access any of the j banks. Any one of the data ports DQ1 through DQn can transfer data to or from any of the j banks through corresponding ports P1 through Pn. And, any one or more of the n data ports can be configured to respond to any one of the r address-command ports. Further, data can be transferred between the data ports bypassing the memory banks. Once again, although FIG. 2B schematically shows ports P1 through Pn to be along one side of memory 200, these ports are physically distributed among the m memory macros. Also, address-command block 210 in FIG. 2B is shown to be physically located in central area 220 in FIG. 2A, though it may be placed in other locations.

Figure 2C:
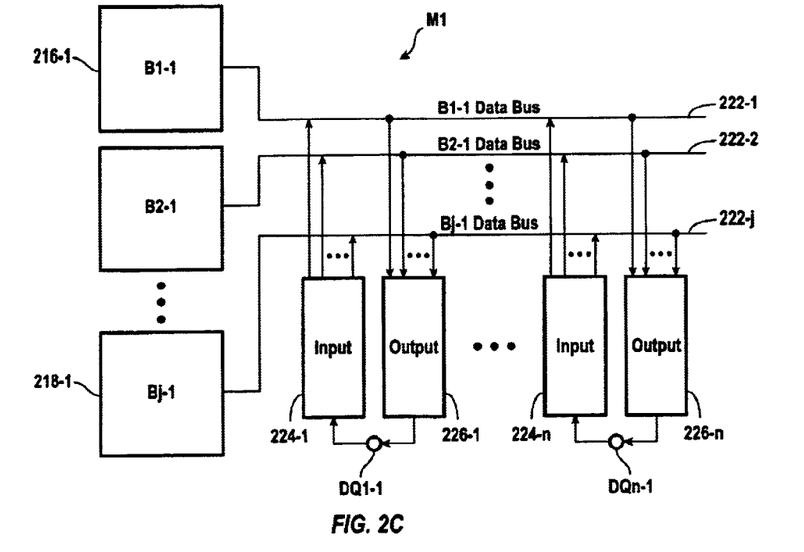

FIG. 2C shows a simplified schematic diagram of the data path of memory macro M1. As shown, a separate data bus is provided for each of the j sub-banks. Each of the j data buses 222-1 through 222-j is coupled to all n sets of input/output registers. In this manner, any one or more of the n data ports can access any one or more of the j banks. The n input registers 224-1 through 224-n in macro M1 are used to transfer write data from one or more of the n data connection points DQ1-1 through DQn-1 to one or more of the j data buses, and the n output registers 226-1 through 226-n are used to transfer read data from one or more of the j data buses to one or more of the n data connection points.

Figure 2D:
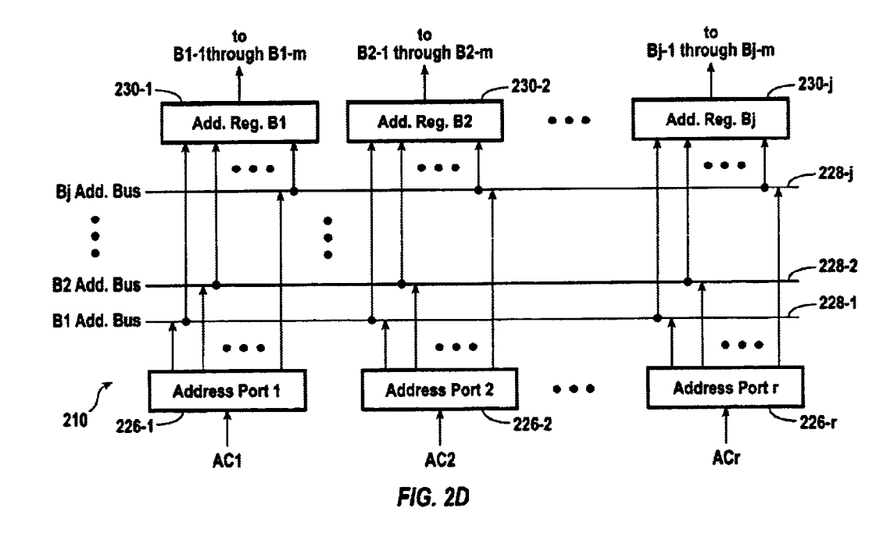

FIG. 2D shows a simplified schematic diagram of the address-command block 210 (FIG. 2B). As shown, a separate address bus and a corresponding address register is provided for each of the j banks. Each of the r address ports 226-1 through 226-r is coupled to all j address buses 228-1 through 228-j. In this manner, any one or more of the r address ports can access any one or more of the j banks. Having a separate address register for each memory bank (registers 230-1 through 230-j) enables configuring the memory to have fewer than n ports with each port being wider than m bits. For example, if memory 200 is designed to have two banks and eight ports with each port being 36 bits wide, then in each memory access, only one of the two banks is accessed. However, the same memory could be reconfigured to have one-half the number of data ports (i.e., four data ports) with each port being twice as wide (i.e., seventy-two bits wide). As another example, the same memory but with four banks rather than two would not only allow the memory to be configured as in the previous example but would also allow the memory to be configured to have one-quarter the number of data ports (i.e., two data ports) with each data port being four times as wide (i.e., one-forty-four bits wide).

Stated in general terms, the number of the internal data connection points in each macro corresponds to the number of the data ports, and the number of the memory macros corresponds to the width of each data port. In one configuration, the number of internal data connection points in each memory macro equals the number of the data ports, and the number of memory macros equals the width of each data port. In another configuration, the number of internal data connection points in each memory macro equals to a multiple X of the number of the data ports, and the number of the memory macros equals a fraction 1/X of the width of each data port, wherein X is a positive integer greater than one.

Thus, whether one of or a multiple of the banks is(are) to be accessed in a given memory access along with the four variables n, m, r, and j determine the full configuration of memory 200. For example, for a single bank access per memory access and variables n=6, m=36, r=3, j=2, memory 200 would have 2 banks, 3 address-command ports, 6 data ports each being 36 bits wide, and 36 memory macros each having 2 sub-banks and 6 data connection point. Alternatively, for the same variables but simultaneously accessing both banks in a given memory access, memory 200 would be configured to have 3 data ports each being 72 bits wide. In this configuration however, in each of the 36 macros, every two of the six data connection points form two bit positions in one of the three data ports.

FIGS. 3A, 3B, 3C, 3D, and 3E show the implementation of a 9 Megabit (9 Mb) memory 300 with two banks, six data ports, three address-command ports, and thirty-six memory macros in accordance with an exemplary embodiment of the invention. Many other memory densities, configurations, and implementations would be obvious to one skilled in the art in view of this disclosure.

Figure 3A:
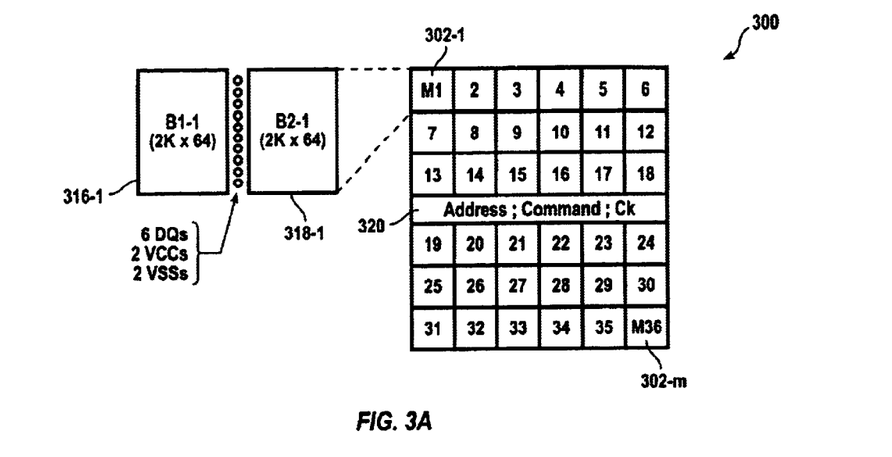
FIGS. 3A, 3B, 3C, 3D, and 3E show the implementation of a 9 Megabit memory in accordance with an exemplary embodiment of the invention.

FIG. 3A, similar to FIGS. 1A and 2A provides a top level physical illustration of the 9 Mb memory. The 9 MB memory is divided into 36 identical memory macros M1 through M36. Each macro has two sub-banks of 2K×64 each and 10 bumps located between the two sub-banks as shown in FIG. 3A. Of the 10 bumps, 6 are data connection points, two are for power supply VCC and two are for ground supply VSS. Two VCC and two VSS bumps are included so that one VCC bump and one VSS bump can be routed to the output buffers and the other VCC and VSS bumps can be routed to internal circuitry. This minimizes the impact of noise due to output buffer witching on internal circuitry. As in FIGS. 1A and 2A, the six data connection points in for example memory macro M1 represent the bit 1 position of the respective 6 data ports DQ1 through DQ6. The six data connection points in the 36 memory macros collectively form the six data port DQ1 through DQ6.

Figure 3B:
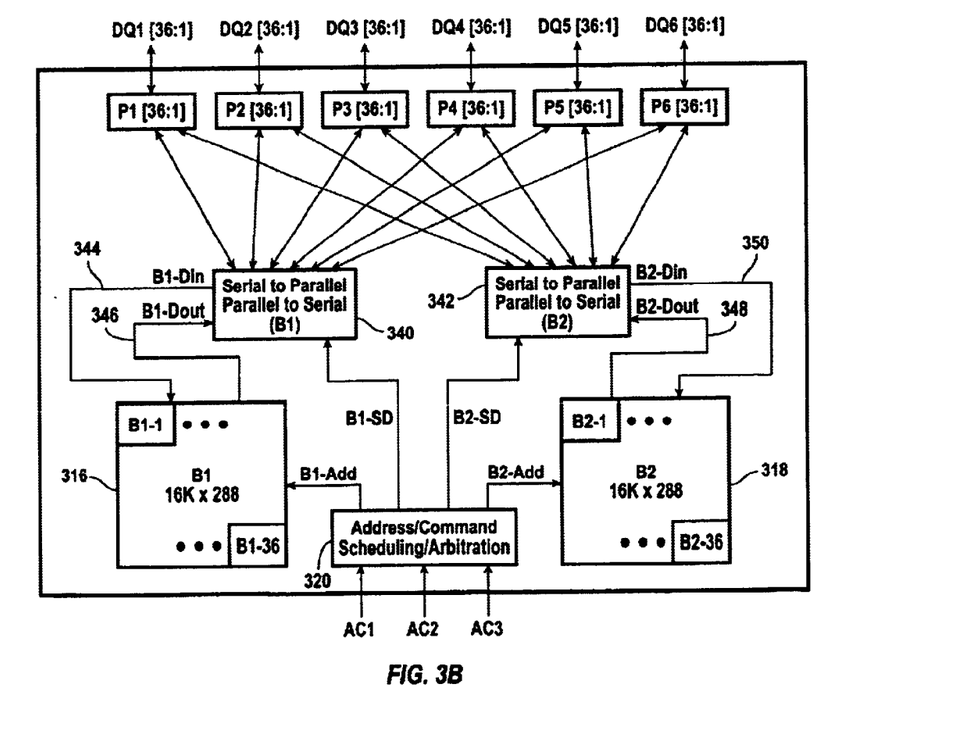

In FIG. 3B, sub-banks B1-1 through B1-36 are distributed among the 36 macros form bank B1, and sub-banks B2-1 through B2-36 also distributed among the 36 macros form bank B2. Each of banks B1 and B2 is 16K×288 bits. Block 320 which includes the address-command logic and the scheduling-arbitration logic receives the three address-command signals AC1 through AC3, and generates address signals B1-Add and B2-Add for banks B1 and B2, respectively. Block 320 further generates control signals B1-SD and B2-SD which are coupled to data path blocks 340 and 342. Block 320 is shown in FIG. 3A to be physically located in the center of memory 300 although it may be placed in other locations depending on the design goals and layout considerations.

In FIG. 3B, bank B1 can be accessed by any of the 6 data ports DQ1–DQ6 through its dedicated data transfer block 340. Similarly bank B2 can be independently accessed by any of the 6 data ports DQ1–DQ6 through its dedicated data transfer block 342. Data retrieved in parallel from bank 1 is serially output by data transfer block 340 to any one or more of the six data ports (serial-to-parallel data output), and data serially provided on any one of the six data ports is provided in parallel to bank B1 for a parallel write operation (serial-to-parallel data-in). Similar data transfer function between the six ports and bank B2 is provided by block 342. Signals B1-SD and B2-SD provided by block 320 indicate to respective data transfer block 340 and 342 what the burst length and the clock multiple for the respective data ports are.

Figure 3C:
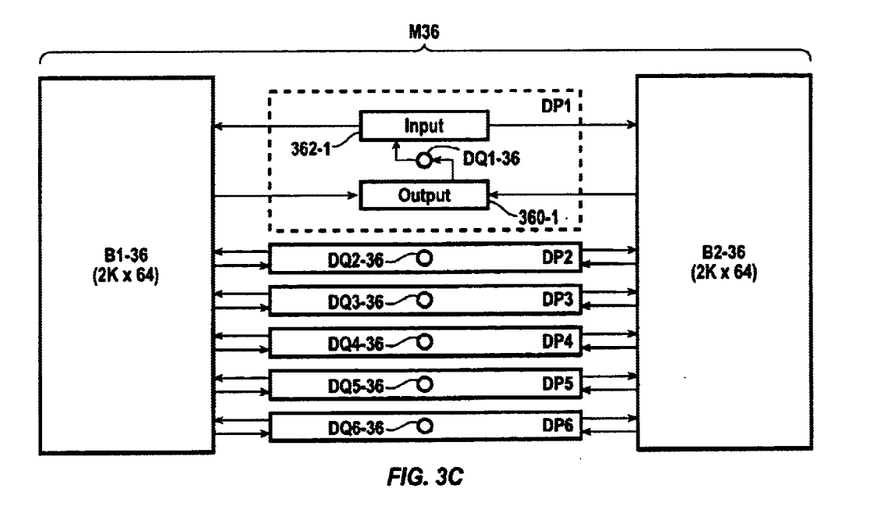

FIG. 3C shows one implementation example of the data path in a memory macro (macro M36). Other implementations would be obvious to one skilled in the art in view of this disclosure. Each of six independent data paths DP1 through DP6 includes an output register 360-1 coupled to receive parallel read data from sub-banks B1-36 and B2-36, and output the data received serially onto corresponding output pad or bump. Each of DP1–DP6 also includes an input register 362-1 coupled to serially receive write data from the corresponding data pad or bump, and provide the write data in parallel to sub-banks B1-36 and B2-36. The six data connection points (output pads or bumps) DQ1-36 through DQ6-36 form the 36th bit location of output ports DQ1 through DQ6 respectively. A more detailed implementation of the data path in memory macro M36 is shown in FIG. 3D.

Figure 3D:
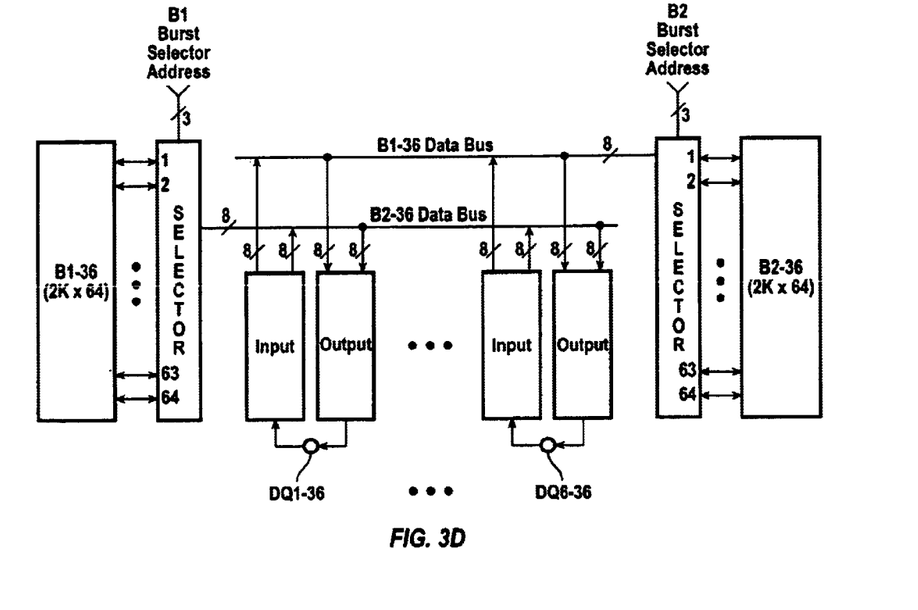

In FIG. 3D, a separate data bus is provided for each of sub-banks B1-36 and B2-36. Each of the two buses is 8 bits wide. The input register and output register coupled to each of the six data connection points DQ1-36 through DQ6-36 are also coupled to both buses to transfer data between the six data connection points and sub-banks B1-36 and B2-36. Each of the sub-banks includes an array of 512 rows by 512 columns. In a read or write operation, 64 memory cells are selected by activating one of the 512 rows and selecting 64 of the 512 columns. In a read operation, the data from the 64 selected memory cells is sensed and then provided to a selector block coupled to the sub-bank. Burst selector addresses operate to select 8 of the 64 bits of data and transfer the 8 selected bits to the corresponding data bus. One or more of the output registers then serially transfer the 8 bits of data to corresponding data connection points.

In a write operation, 8 bits of data serially provided on one of the six data connection points is transferred in parallel to one of the two sub-bank buses. The corresponding selector along with column selection (not shown) operate to select eight of the 512 columns to which the 8 bits of write data are transferred. Eight memory cells along an activated row are then programmed.

The block diagram in FIG. 3D enables simultaneous read accesses to both banks B1 and B2 and simultaneous write accesses to both banks B1 and B2. As described earlier, under this mode of operation, memory 300 would be reconfigured as a 3 data port memory with each port being 72 bits wide rather than a 6 data port memory with each port being 36 bits wide.

Figure 3E:
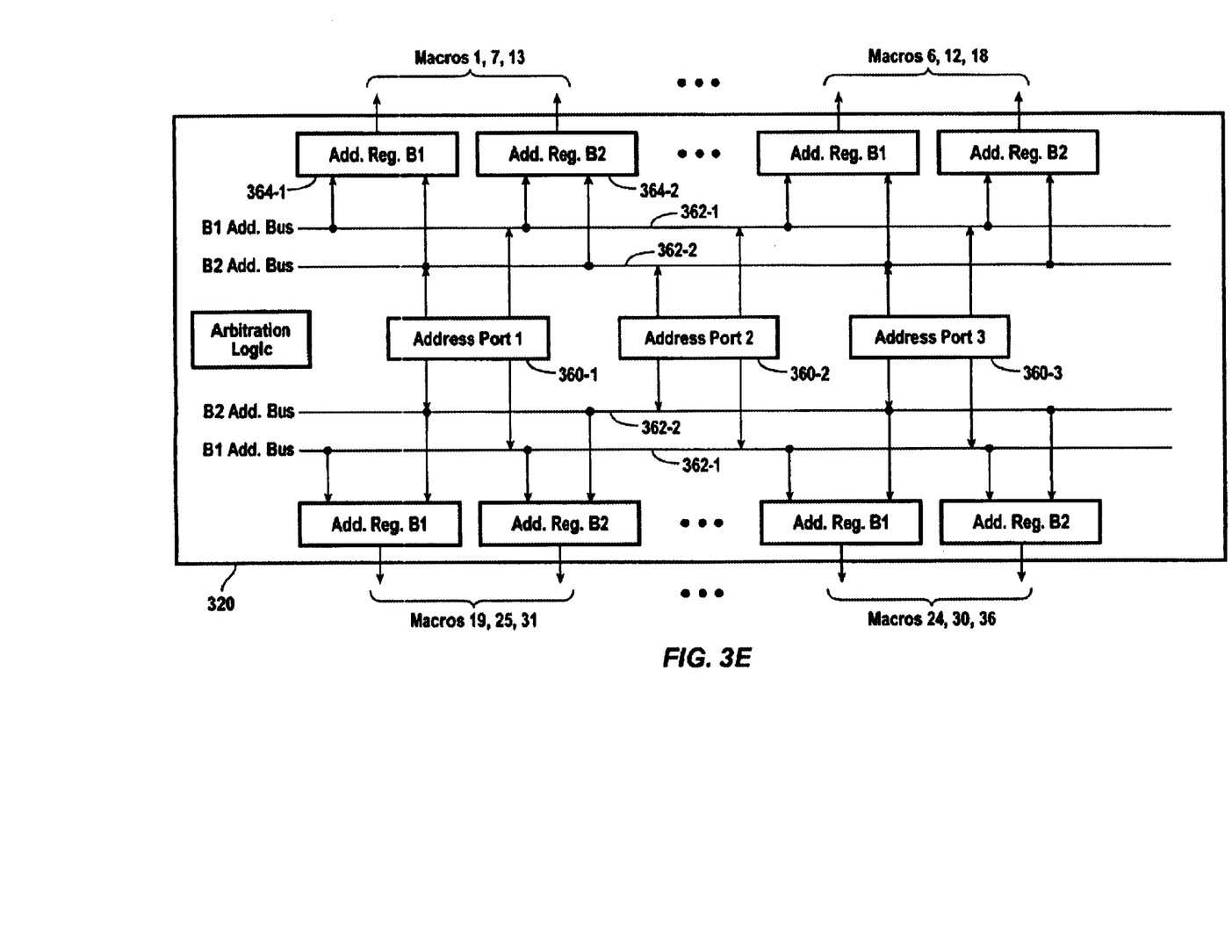

FIG. 3E shows a simplified schematic diagram of the address-command block 320 (FIG. 3B). As shown, a separate address bus and a corresponding address register is provided for each of the 2 banks in a distributed fashion. Each of the three address ports 360-1 through 360-3 is coupled to both address buses 362-1 and 362-2. Two sets of address buses 362-1 and 362-2 are shown, the upper set is coupled to address registers driving the column select circuit in the upper 18 macros (i.e., M1 through M18), and the lower set is coupled to address registers driving the column select circuit in the lower 18 macros (i.e., M19 through M36). The particular physical location and distribution of the address registers is dictated by layout and performance constraints. Many different ways of implementing the address registers are possible. However, by providing a separate address register for each bank, any one or more of the three address ports can access either of the 2 banks. Having a separate address register for each memory bank allows configuring the memory as a 3 port memory with each port being 72 bits wide.

Figure 4A:
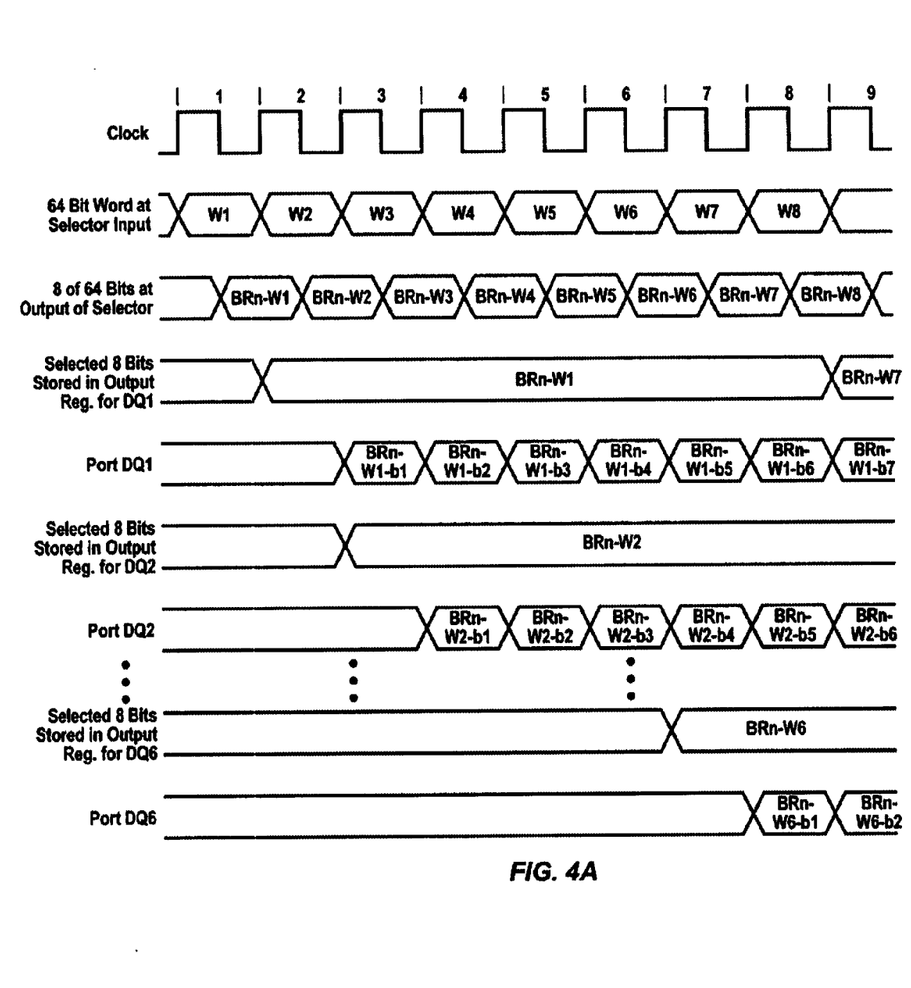
FIG. 4A shows an exemplary timing diagram for bit and burst sequencing during multi-port read operations.
Figure 4B:
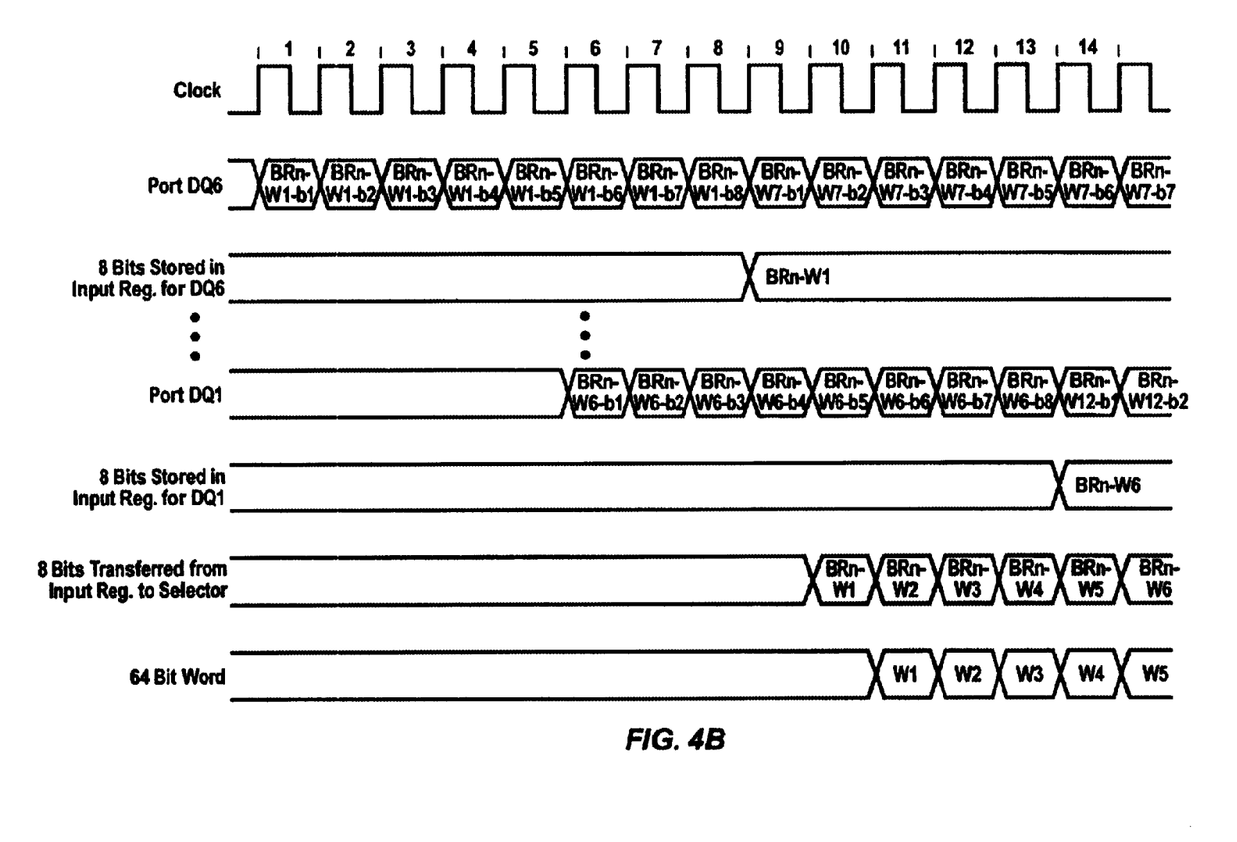
FIG. 4B shows an exemplary timing diagram for bit and burst sequencing during multi-port write operations.
Figure 4C:
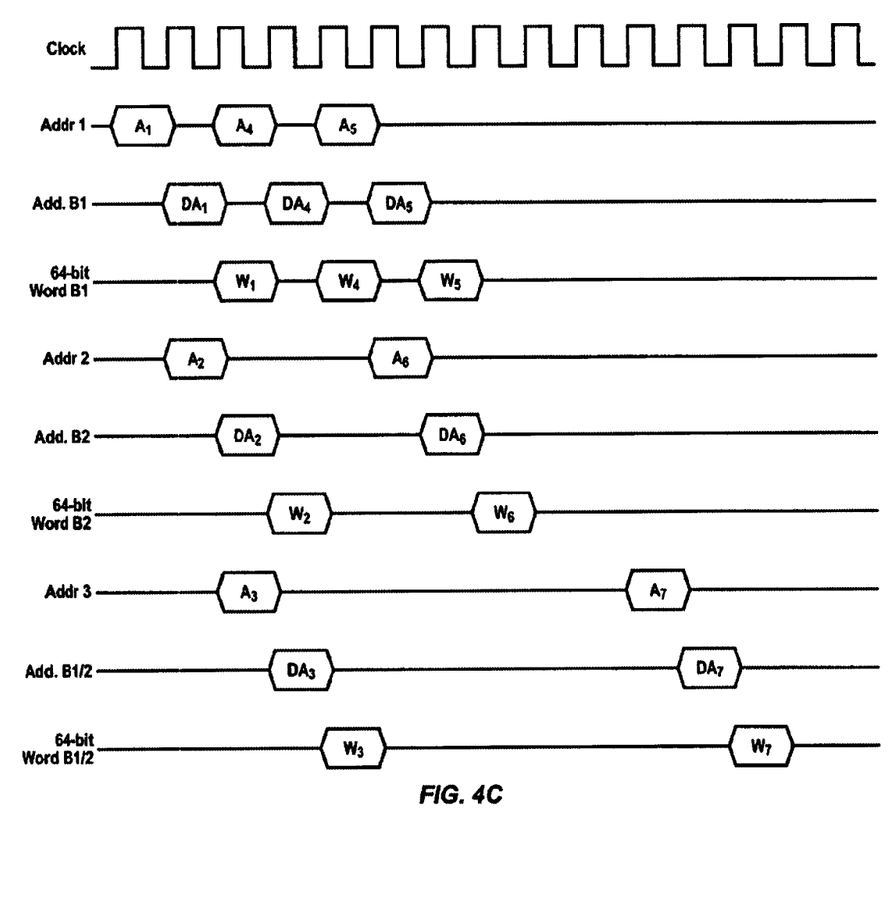
FIG. 4C provides an example of the address port sequencing.

Next, timing diagrams in FIGS. 4A, 4B, and 4C are used to describe the operation of memory 300 in more detail. FIG. 4A shows an exemplary timing diagram for bit and burst sequencing during multi-port read operations. This timing diagram reflects the memory read operations wherein one bank occupies the six data ports. Although FIG. 4A shows the read operation for burst=8, modifying the timing diagram to show the read operation for burst=2 or 4 would be obvious in view of this disclosure. As described earlier, in a read access to for example bank 1, 64 bits of data are selected from each of the 36 sub-banks of bank B1. Of the 64 bits from each sub-bank, 8 bits are selected and the remaining 56 bits are ignored. The selected 8 bits from each of the 36 sub-banks of bank B1 are then serially read out in a burst of 8 clock cycles.

In FIG. 4A, 10 read accesses to bank B1 are shown in 10 sequential clock cycles. In each read access, one 64-bit word W is retrieved from each of the 36 sub-banks of bank B1. Thus, ten 64-bit words W1–W10 are sequentially retrieved. Following through with only word W1, on the falling edge of the first clock cycle burst selector address (FIG. 3D) selects 8 bits from word W1. This is shown in the third waveform from top as BRn-W1. On the rising edge of the second clock cycle, the output registers coupled to data port DQ1 in each memory macro store the corresponding selected 8 data bits. On the rising edge of the third clock cycle, the selected 8 data bits are sequentially output onto data port DQ1 by corresponding output registers in 8 clock cycles. If the burst mode is set to 2 (or 4), only 2 (or 4) of the 8 data bits are sequentially output by output registers. With a total of 6 available data ports, 8 bits from each of words W2 through W6 are similarly output onto respective data ports DQ2–DQ6 with one clock cycle separation between the time each of the 8 bits of data start being sequentially output on DQ2–DQ8. The above sequence of operations repeats again starting with word W7. The timing diagram in FIG. 4A is intended to be illustrative only. For example, two sequential memory accesses need not be to same memory bank.

FIG. 4B shows an exemplary timing diagram for bit and burst sequencing during multi-port write operations. The timing sequence for write operations is simply the reverse of the read timing using the input registers in each memory macro. Again, assuming the burst mode is set to 8, 8 bits of data are sequentially transferred from data port DQ6 into corresponding input registers of each memory macro over eight clock cycles. The eight bits are then selectively transferred to 8 bitlines selected from 64 preselected columns. With a total of 6 available data ports, five other groups of 8 data bits each can similarly be transferred from data ports DQ2–DQ6 to corresponding input registers with clock cycle separation between the time each group of 8 data bits starts being sequential transferred.

FIG. 4C provides an example of address port sequencing. Three sets of timing sequences covering each of burst modes of 2, 4, and 8 are provided. Address port 1 is used to show the address sequencing for burst of 2 (upper three waveforms directly below clock waveform), address port 2 is used to show the address sequencing for burst of 4 (the next three waveforms below those for address port 1), and address port 3 is used to show the address sequencing for burst of 8 (bottom three waveforms). As shown by the waveforms for address port 1, a new address A1 is provided on address port 1 in the first clock cycle. The new address is then written into the address register for bank B1 in the following clock cycle. In the third clock cycle, a 64 bit word (W1) is selected from each sub-bank of bank B1 in response to the address stored in the address register. Operating address port 2 under a burst mode of 2, two clock cycles need to pass from the first address (A1) before a new address (A4) can be provided on address port 1. However, in the second clock cycle, a new address (A2) can be provided on address port 2. In the third clock cycle, address A2 is stored in address register for bank B2, and in the fourth clock cycle, a 64 bit word (W2) is selected from each sub-bank of bank B2. Operating address port under a burst mode of 4, four clock cycles need to pass from the first address (A2) before a new address (A6) can be provided on address port 2. With a third address port available, in the third cycle, a new address (A3) can be provided on address port 3. In the fourth clock cycle, address A3 is stored in the address register for either bank B1 or bank B2. In the fifth clock cycle, a 64 bit word (W3) is selected from each sub-bank of either bank B1 or B2. Again, since address port is operating under a burst mode of 8, eight clock cycles need to pass from the first address (A3) before a new address (A7) can be provided on address port 3.

As can be seen, high memory bandwidth is achieved by breaking up the 9 Mb memory into 36 smaller arrays which are accessed independently and simultaneously. The small arrays result in small bitlines and wordlines which in turn result in reduced wordline delay and high speed data sensing (due to low bitline capacitance). This coupled with the substantially reduced data bussing as a result of data paths being localized to each of the 36 memory macros help achieve high speed memory access. Further by eliminating the large amount of data bus routing in traditional memory architectures where each bank supplies a full data width to on chip busses the power consumption and silicon area consumption are substantially reduced.

FIGS. 5A, 5B, and 5C show three ways of integrating the memory die with a low dielectric constant (k) interconnect substrate (interposer) and a standard package such as a ball grid array (BGA). The interconnect substrate with its low resistivity, high density, single or multi-layer interconnect traces serves as the routing layer for such performance sensitive signal lines as data bus lines and clock signals. Contrary to the mechanical process by which conventional packages are formed, the low k interconnect substrate is formed using lithography manufacturing processes similar to those used in manufacturing semiconductor wafers. This type of substrate is processed to produce high performance interconnect layers. The process for forming Convention flip-chip technology may be used to help achieve the desired result.

FIG. 5A shows the low k interconnect substrate 512 to be integrated with package 514, with memory die 510 being coupled to substrate 512 using IC solder bumps. Interconnect lines in substrate 512 route the internal data connection points in each macro (e.g., macros M1 through M36 in FIG. 3A) to the corresponding data port terminals forming the six data ports DQ1–DQ6.

FIG. 5B shows the low k interconnect substrate 512 to be independent of both the memory die and the package. Here, die 510 is coupled to substrate 516 through IC solder bumps 511, and substrate 516 is in turn coupled to package 518 via chip-scale connections 517. The routing of the different signal lines is similar to FIG. 5A.

FIG. 5C shows the low k interconnect substrate 522 to be integrated with memory die 520, and then the substrate being coupled to the package via chip-scale connections 517. A more detailed implementation of this approach is described in more detail in the commonly assigned U.S. Pat. No. 6,400,575, titled "Integrated Circuits Packaging Systems and Method", issued Jun. 4, 2002, incorporated herein by reference.

The clock signals may be routed through substrate 512 using the technique described in the text "Low Power Design Methodology" by Jan M. Rabaey and Massoud Pedram, Kulwer Academic Publishers, second printing 1996, p. 119–123, incorporated herein by reference.

Memory 300 can be configured to operate in one of a number of modes. A few of these modes are described below.

I. Single Port Mode

Memory 300 can be configured to be a single ported 144-bit wide by operating 4 DQ ports in parallel. An externally provided asynchronous output enable can be used to avoid bus contention if multiple memories 300 are bused together. Peak speed may not be attainable in a bussed architecture, depending on topology. In this mode, only one of the address input ports would be used by the memory controller.

II. Quad Data Rate (QDR) Mode

A second mode of operation is QDR-compatible with 72$b$ buses. The DQ ports are operated as separate D & Q buses, and memory 300 can burst data in and out at the same time without regard for bus turn around. The same or separate address buses can be used for both read & write addresses. Memory 300 has enough internal bandwidth to fully occupy both the input & output buses.

III. Quad-Port Mode

A third mode is bi-directional Quad-ported memory, with 4 DQ ports.

IV. Hex-Port Mode

In a fourth mode of operation, memory 300 is configured to have 6 DQ ports, each 36 wide, which can be configured as any rational combination of D (Din) ports, Q (Dout) ports and DQ ports. In this configuration, two (or more) separate processors or controllers can simultaneously access the two internal memory banks. By using all the address buses, there is no address and control bus conflict for accessing the banks allocated to a particular processor. In this mode, all three address-command ports are active. It is permissible to operate each of the DQ ports in different modes. That is, it is possible to operate 2 as a D and Q pair and one as DQ. For example, this sort of functionality could be used in the following manner: D1 is Ingress of data, DQ3 is a bi-directional data bus to a processor, and Q2 is Egress of data that has been processed or tagged appropriately for forwarding (as in the case of a Network processor). All these streams of data can be under the control of the NPU through only one of the address-command ports. Note that this feature could also be used to supply new data to or retrieve data from a common pool of a number of memories 300 used by dual SMP, without interrupting the use of the memories by the processors. (i.e. each processor could have a separate D & Q streaming data to/from the processor while new data to be worked on is supplied through a DQ port.)

V. Flow-Through

As part of this mode of operation, it is also possible to use the data coherency circuitry to form a bypass path for direct communication between 2 separate data ports, allowing one processor to burst directly to a second processor, either to maintain cache coherency of common data or to communicate results in a low latency manner, without intermediate buffering. This scheme eliminates separate bus buffers, or many additional I/O for a separate communication path between processors, or between processor and memory 30. The latency of the flow-through is similar to a write on the input port followed immediately by a read from the output port. Flow-through mode is only available for buses that are programmed to be the same width, and latency, although they may be programmed to be different function (i.e. a D port may be used to flow-through to a Q or DQ port, for example).

Internal Bandwidth

Each of the 2 banks B1 and B2 operates at the maximum clock frequency with a pre-fetch of 8 data bits. For dual ported operation at 72*b* wide, a new read or write cycle can start every clock cycle without regard to collisions internally from either address-command ports. This is true for burst length=4 or burst length=8 operation. For quad ported operation, each bank can provide the bandwidth of all 4 data ports at 36*b* wide and both address-command ports.

For burst length=4 in quad ported mode, if it is desired to start a new memory access cycle every rising edge of the clock then the controller must take into account the destination banks and configuration of the device since accesses from all 4 data ports to the same bank would require 4 accesses within 2 clock cycles (burst 4 period is 2 clock cycles for DDR operation), which can not be supported at one access per clock cycle internally. This is not an issue for uses of the memory as a "ping pong" buffer for communicating between processing threads or devices where collision would be avoided by design.

For burst length=8 mode, there is enough bandwidth internally to supply collision-less quad ported operation (i.e., each address-command port can issue read or write without regard to the other address-command ports).

Clocking Scheme

In order to provide the minimum skew and lowest power clock distribution for the die, a majority of the clocks are distributed by the package or module substrate. The first level of the clock tree may be implemented in the package or module rather than on the die. Each clock may be provided with an input clock buffer and the output of those buffers routed to the appropriate clock destinations with the appropriate clock skews.

The multi-ported memory technique of the present invention may be advantageously used in a number of different applications. In one application, memory 300 can be used as a quad-ported memory with 2 "expansion ports", even though the ports are mostly symmetrical logically. Two-hundred-eighty-eight (288) wide memory gives a prefetch of 8 for 36-wide data ports. Since the data rate can be double-data-rate (DDR) on all ports, for burst length of 8, four commands can be issued during a data burst. This means that four bursts can be happening simultaneously on four ports, without requiring arbitration externally, as long as the external latency is long enough for the memory to schedule the four competing commands so they don't collide for a bank. (This is 1 clock longer than the "natural" latency.) This gives address-command ports AC1 and AC2 the ability to use one bank while address-command port AC3 uses the other bank, and vice versa, without collisions, for example.

There is enough internal bandwidth to support 8 ports, if both banks are fully utilized, and the architecture can be expanded to include "N" ports, depending on system need.

"Snooping" means that as data is written into the memory on one port, it can be presented on another port without interfering with the transfer, or electrically loading the input bus with I/O for the "snooping" device. It can be useful for parts of a packet to be available immediately to an NPU, for example, as it is being written into the memory, so that QoS decisions can be started as soon as possible. Pass-through also allows lowest possible latency for buses to communicate with each other without actually writing the memory if that is desired, as opposed to first writing and then reading out a different port to communicate. This could potentially eliminate side band signals or buses for direct communication.

While the above is a complete description of the embodiments of the present invention, it is possible to use various alternatives, modifications and equivalents. Therefore, the scope of the present invention should be determined not with reference to the above description but should, instead, be determined with reference to the appended claim, along with their full scope of equivalents.

What is claimed is:

1. A semiconductor memory comprising:
   a plurality of data ports each having a predetermined number of data bits;
   a plurality of memory macros each comprising:
   at least one memory array having rows and columns of memory cells; and
   a plurality of internal data connection points directly connected to external terminals to transfer data to or from the at least one memory array, the plurality of internal data connection points being equal in number to the number of the plurality of data ports,
   wherein the plurality of internal data connection points in the plurality of memory macros together form the plurality of data ports, and the plurality of memory macros equals in number to the predetermined number of data bits in each of the plurality of data ports.

2. The semiconductor memory of claim 1 further comprising an integrated circuit housing the plurality of memory macros, wherein each of the plurality of internal data connections pints is directly coupled to a corresponding external data connection point.

3. The semiconductor memory of claim 2 further comprising:
   a package; and
   an interconnect substrate coupled between the integrated circuit and the package, the interconnect substrate housing the external data connection points and data interconnect lines configured to couple each of the external data connection points to a corresponding data terminal in the package.

4. The semiconductor memory of claim 1 wherein each of the plurality of memory macros includes a full read and write data path independent of the data path in the other of the plurality of memory macros.

5. A semiconductor memory comprising:
   a plurality of data ports each having a predetermined number of data bits;
   a plurality of memory macros each comprising:
   at least one memory array having rows and columns of memory cells; and
   a plurality of internal data connection points directly connected to external terminals to transfer data to or from the at least one memory array, the plurality of internal data connection points being equal in number to a multiple X of the number of the plurality of data ports,
   wherein the plurality of internal data connection points in the plurality of memory macros together form the plurality of data ports, and the plurality of memory macros equals in number to a fraction 1/X of the predetermined number of data bits in each of the plurality of data ports, X being a positive integer greater than one.

6. The semiconductor memory of claim 5 further comprising an integrated circuit housing the plurality of memory macros, wherein each of the plurality of internal data connections pints is directly coupled to a corresponding external data connection point.

7. The semiconductor memory of claim 6 further comprising:

a package; and an interconnect substrate coupled between the integrated circuit and the package, the interconnect substrate housing the external data connection points and data interconnect lines configured to couple each of the external data connection points to a corresponding data terminal in the package.

8. The semiconductor memory of claim 5 wherein each of the plurality of memory macros includes a full read and write data path independent of the data path in the other of the plurality of memory macros.

* * * * *